US011620427B1

(12) United States Patent
Liu et al.

(10) Patent No.: US 11,620,427 B1
(45) Date of Patent: *Apr. 4, 2023

(54) PATTERN BASED DIE CONNECTOR ASSIGNMENT USING MACHINE LEARNING IMAGE RECOGNITION

(71) Applicant: Synopsys, Inc., Mountain View, CA (US)

(72) Inventors: Xun Liu, Durham, NC (US); Shamik Saha, Durham, NC (US)

(73) Assignee: Synopsys, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/378,241

(22) Filed: Jul. 16, 2021

Related U.S. Application Data (63) Continuation of application No. 16/904,103, filed on Jun. 17, 2020, now Pat. No. 11,100,270.

(60) Provisional application No. 62/864,530, filed on Jun. 21, 2019.

(51) Int. Cl.
  *G06F 30/39* (2020.01)
  *G06F 30/392* (2020.01)
  *G06F 30/27* (2020.01)
  *G06N 3/08* (2023.01)
  *G06V 30/242* (2022.01)

(52) U.S. Cl.
  CPC ............ *G06F 30/392* (2020.01); *G06F 30/27* (2020.01); *G06N 3/08* (2013.01); *G06V 30/242* (2022.01)

(58) Field of Classification Search
  CPC ...... G06F 30/39; G06F 30/392; G06F 30/394; G06F 30/398; G06F 30/27; G06N 3/08; G06V 30/242; G06K 9/6807

USPC ......................................................... 716/119
See application file for complete search history.

(56) References Cited

U.S. PATENT DOCUMENTS

| | | | |
|---|---|---|---|
| 5,479,570 A | 12/1995 | Imagawa et al. | |
| 10,599,807 B2 | 3/2020 | Sha et al. | |
| 2014/0002122 A1* | 1/2014 | Dibattista | G06F 30/392 |
| | | | 716/119 |
| 2014/0372960 A1 | 12/2014 | Ward | |
| 2021/0073456 A1 | 3/2021 | Nath et al. | |

\* cited by examiner

OTHER PUBLICATIONS

Wu, N. et al., "Tensorflow detection model zoo," Why GitHub?, 2017, six pages, [Online] [Retrieved on Jun. 26, 2020], Retrieved from the Internet <URL:https://github.com/tensorflow/models/blob/master/research/object_detection/g3doc/detection_modelzoo.md>.

*Primary Examiner* — Paul Dinh
(74) *Attorney, Agent, or Firm* — Fenwick & West LLP (57) ABSTRACT

A method for assigning connections between IO pad pins and connectors on an integrated circuit (IC) die. A pattern (300) including a physical layout of connectors (302) and pad pins (304) is associated with a mapping of connections between the connectors (302) and the pad pins (304). A processor (204) identifies instances (402, 404) of the pattern (300) within a design image (400) of an integrated circuit (IC) die using a machine learning model. The design image (400) includes a physical layout of connectors (414) and pad pins (416). For each identified instance (402, 404) of the pattern (300) within the design image (400), the mapping of connections is assigned to respective connectors (414) and pad pins (416) in the identified instance (402, 404).

20 Claims, 11 Drawing Sheets

PATTERN BASED DIE CONNECTOR ASSIGNMENT USING MACHINE LEARNING IMAGE RECOGNITION

CROSS-REFERENCE TO RELATED APPLICATION(S)

This application is a continuation of U.S. application Ser. No. 16/904,103, filed Jun. 17, 2020, which application claims priority to U.S. Provisional Patent Application No. 62/864,530, filed Jun. 21, 2019, which is incorporated herein by reference in its entirety.

TECHNICAL FIELD

The present disclosure relates to inter-die connector assignment utilizing machine learning.

BACKGROUND

Integrated circuit (IC) dies use surface mounting connectors to enable ever growing design complexity and high demand for data throughput. An IC die may include on-chip devices including input/output (IO) pads with pad pins. The pad pins are connected to the connectors (e.g., bumps) of the IC die and the connectors are connected to another device, such as a package or another IC die. As such, the on-chip devices of the IC die communicate with the other device via the connectors.

The task that determines which connectors are physically connected to which pad pins is called assignment. Optimizing an assignment, such as in terms of routability and wirelength metrics, is a difficult task when the IC die includes large numbers of connectors and pad pins.

SUMMARY

Some embodiments include a method for assigning connections between pad pins and connectors on an integrated circuit (IC) die. A pattern including a physical layout of connectors and pad pins is associated with a mapping of connections between the connectors and the pad pins. A processor identifies instances of the pattern within a design image of the IC die using a machine learning model. The design image includes a physical layout of connectors and pad pins within the IC die. For each identified instance of the pattern within the design image, the mapping of connections of the pattern is assigned to respective connectors and pad pins in the identified instance.

In an embodiment, the pattern is associated with a base pattern image. The machine learning model identifies the base pattern image within the design image as instances of the pattern. The machine learning model also identifies perturbations of the base pattern image within the design image as instances of the pattern. The perturbations of the base pattern image identified as instances of the pattern may include an enlarged or shrunken transformation of the base pattern image, a pitch adjustment of the base pattern image, or a component modification to the base pattern image. The processor identifies each instance of the pattern within the design image based on the instance containing a same number and type of connectors as in the first pattern and the instance containing a same number and type of pad pins as in the first pattern.

In an embodiment, each pattern within a library is associated with a corresponding mapping. Each pattern includes a physical layout of connectors and pad pins and each corresponding mapping includes connections between the connectors and the pad pins. The processor identifies instances of each of the patterns within the library within the design image of the IC die. For each identified instance, the corresponding mapping of connections is assigned to respective connectors and pad pins on the identified instance.

In an embodiment, a user interface allows a user to assign connectors and pad pins that are not identified within the instances by the processor. The user interface allows the user to modify the assignment of the mapping of connections to identified instances of the pattern. The user interface allows the user to identify an instance of a pattern that is not identified by the processor using the machine learning model. The machine learning model is trained using an image of the instance as an example of the pattern.

In an embodiment, the machine learning model is trained using a training set of pattern images of a plurality of physical layouts of connectors and pad pins, wherein the training set of pattern images includes, for the pattern, a base pattern image and perturbations of the base pattern image.

Some embodiments include a system including a memory storing instructions and a processor, coupled with the memory and to execute the instructions. The instructions when executed cause the processor to: associate a pattern including a physical layout of connectors and pad pins with a mapping of connections between the connectors and the pad pins; identify instances of the pattern within a design image of the IC die, the design image including a physical layout of connectors and pad pins within the IC die; and for each identified instance of the pattern within the design image, assign the mapping of connections to respective connectors and pad pins in the identified instance.

Some embodiments include non-transitory computer readable medium comprising stored instructions, which when executed by a processor, cause the processor to: associate each pattern within a library with a corresponding mapping, each pattern including a physical layout of connectors and pad pins and each corresponding mapping including connections between the connectors and the pad pins; identify, using a machine learning model, instances of each of the patterns within the library within a design image of an integrated circuit (IC) die, the design image including a physical layout of connectors and pad pins within the IC die; and for each identified instance, assigning the corresponding mapping of connections to respective connectors and pad pins in the identified instance.

Other aspects include components, devices, systems, improvements, methods, processes, applications, non-transitory computer readable mediums, and other technologies related to any of the above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to pattern based inter-die connector assignment using machine learning-based image recognition. The IO (input/output) design of a die includes the following steps:
1) Creation and placement of inter-die connectors on the die.
2) Creation and placement of IO pads and IO pad pins (also referred to as "pad pins") of the IO pads on the die.
3) Physical connection between the connectors and the pad pins.

The task that determines which connectors are physically connected to which pad pins is called assignment. Conventional assignment techniques attempt to solve the assignment problem in a sequential manner, processing one connector at a time. However, the total number of possible assignments is enormous, equal to a factorial function of the number of available connectors when all combinations are considered, and thus it is difficult or impossible to optimize the assignment within a reasonable time period using the sequential technique. Furthermore, the measurement of quality of result (QoR) of an assignment can only be done accurately by redistribution layer (RDL) routing after assignment is completed because poor assignments can introduce routing congestion and thus unrouteable nets. As a result, conventional assignment techniques result in long runtime and poor QoR.

Therefore, various embodiments apply image and pattern recognition using machine learning techniques to identify instances of patterns within a design image of an IC die. Each pattern is associated with a mapping of connections between connectors and pad pins. The mapping of connections in each pattern is assigned to the connectors and pad pins in each identified instance of the pattern in the design image.

Advantages of the present disclosure include, but are not limited to, faster runtime and higher QoR for the inter-die connector assignment problem. Each pattern that is used to train a machine learning model for pattern recognition is sufficiently small (e.g., 100-1000 times smaller than the entire chip interface design of the IC) such that optimal assignment having high QoR can be more easily derived. Furthermore, the use of machine learning pattern recognition allows assignment to be performed concurrently for groups of connectors and pad pins identified in pattern instances, thereby improving assignment runtime. Pattern based die connector assignment can be applied to ICs of any IO design style with high-level effectiveness, supports assignment result reuse, and can include a self-learning capability to improve itself.

Figure 1A:
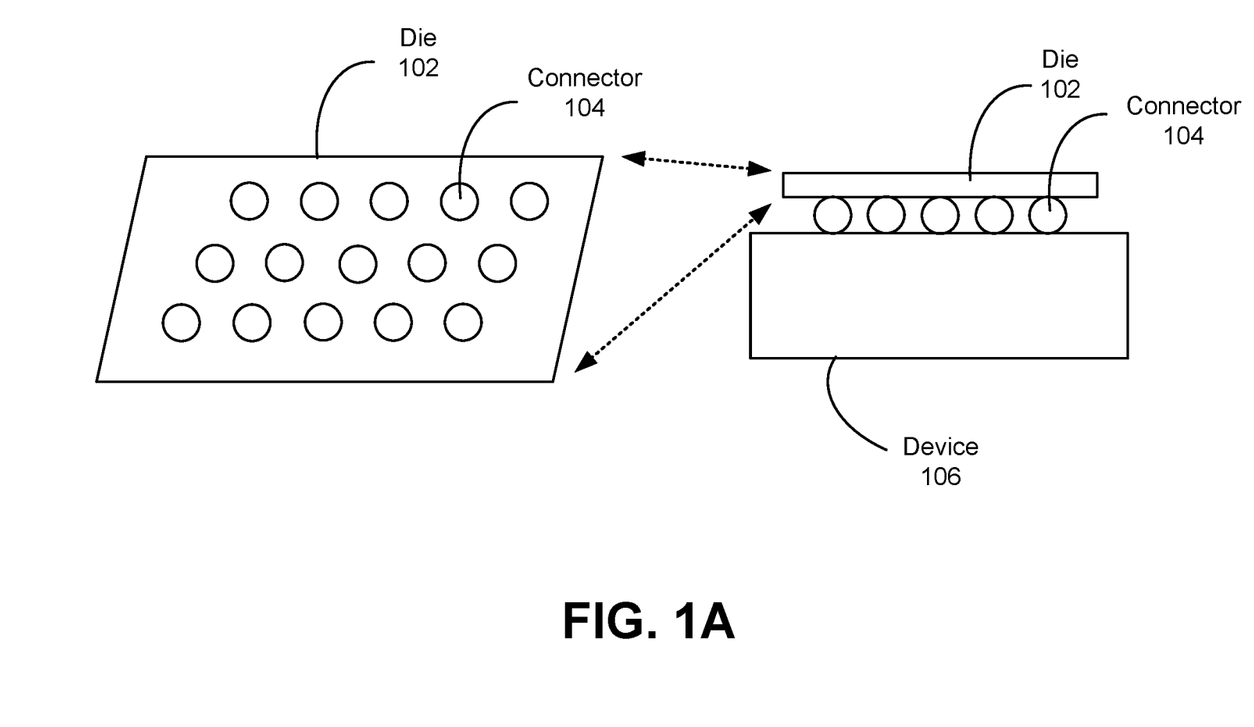
FIG. 1A depicts connectors between an IC die and another device in accordance with some embodiments of the present disclosure.

FIG. 1A depicts connectors 104 between an IC die (or "die") 102 and another device 106. The other device 106 may be a package or other IC die. The connectors 104 are placed on the surface of the die 102 to form pathways for signals to go back and forth between the die 102 and the other device 106, such as a package or another die. The connectors 104 may include solder balls, bumps, or metal bond contacts. Inter-chip communication based on surface mounting connectors 104 have significant advantages over wire bonding.

The connectors 104 often have substantially larger dimension than on-chip devices. Therefore, special devices on the die 102, called input/output (TO) pads, are connected to the connectors 104 for inter-chip communication.

Figure 1B:
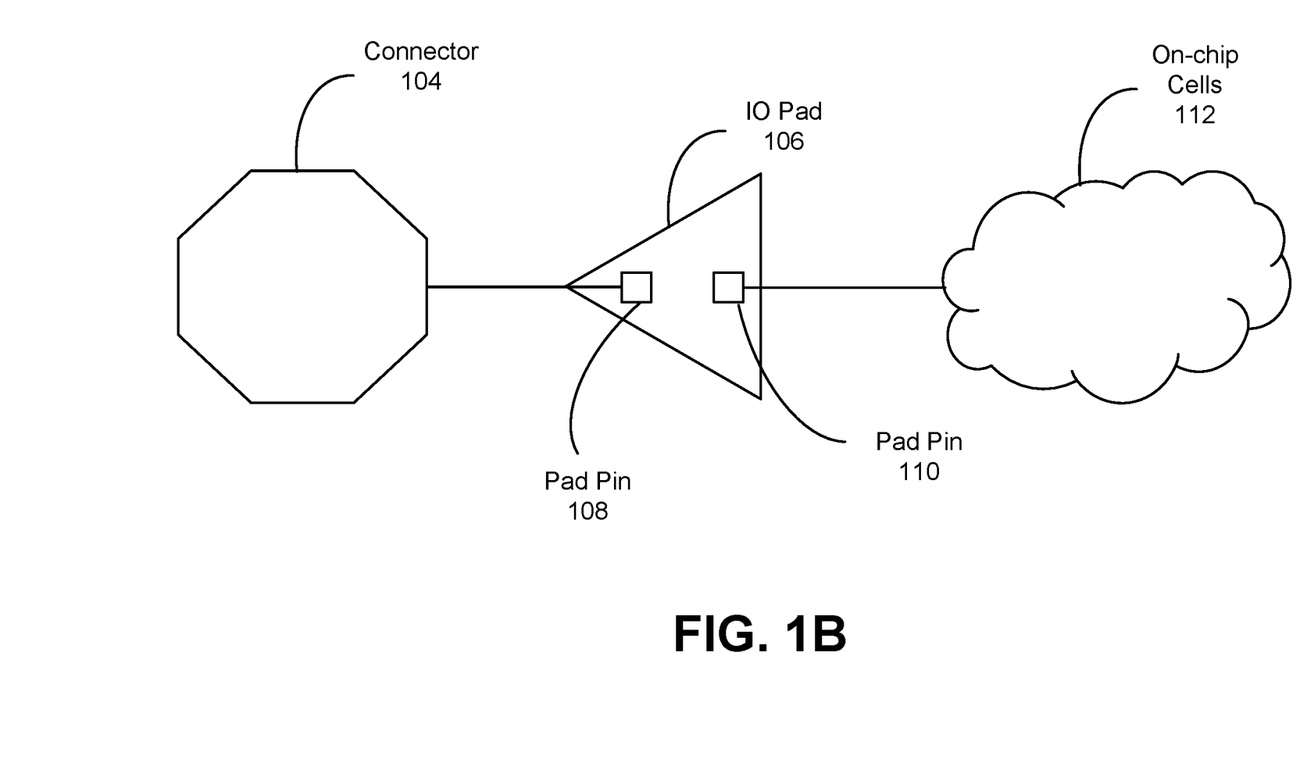
FIG. 1B depicts logical connectivity among connectors, IO pins including pad pins, and on-chip cells in accordance with some embodiments of the present disclosure.

FIG. 1B depicts logical connectivity among connectors 104, IO pads 106 including pad pins 108 and 110, and on-chip cells 112. An IO pad 106 must have at least two pad pins. A pad pin 108 of the IO pad 106 is connected to the connector 104. The pad pin 110 of the IO pad 106 is connected to one or multiple on-chip cells 112.

Figure 1C:
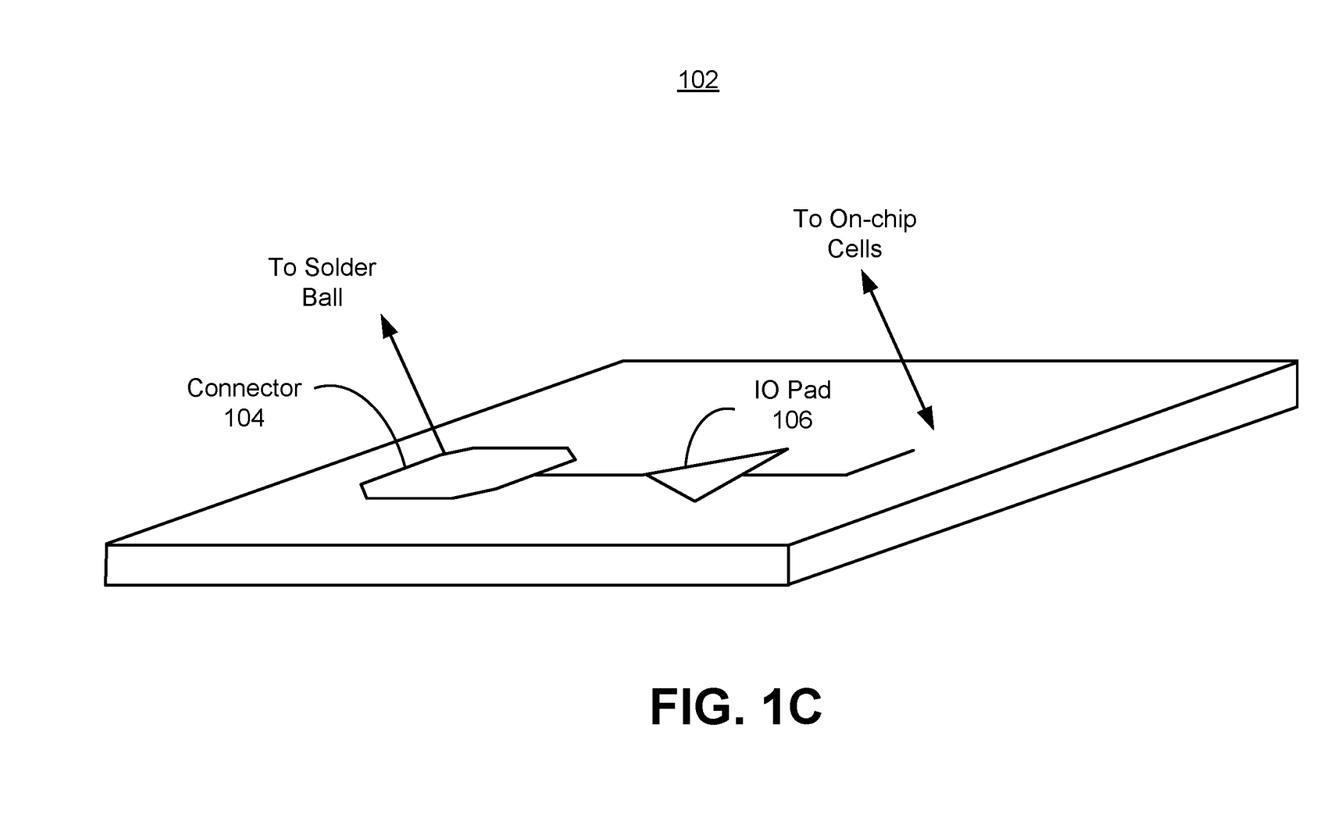
FIG. 1C depicts an IO design on an IC die in accordance with some embodiments of the present disclosure.

FIG. 1C depicts an IO design on an IC die 102. The connector 104 is a passive device used to connect the IC die 102 to off-die devices. The IC die 102 may include the IO pad 106, which is often referred as an IO driver or on-chip buffer, that drives an inter-chip signal through the connectors 104. The connector 104 may include a shaped metallic region on the die 102, and may also include a solder ball because the shaped metallic region and the solder ball form a single conductor.

Figure 2:
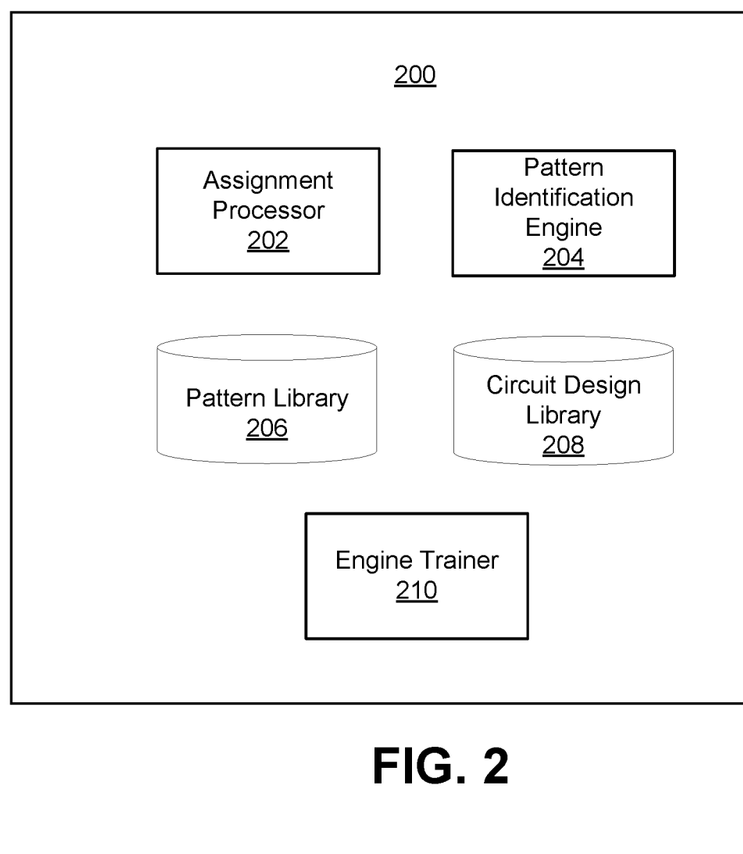
FIG. 2 depicts a system for assigning connectors with pad pins for an IC die using pattern recognition in accordance with some embodiments of the present disclosure.

FIG. 2 depicts a system 200 for assigning connectors with pad pins for an IC die using pattern recognition. The system 200 includes an assignment processor 202, a pattern identification engine 204, a pattern library 206, a circuit design library 208, and an engine trainer 210.

The assignment processor 202 is a software tool running on circuitry (e.g., one or more processors) that performs the assignment task by assigning connections between connectors and pad pins of an IC die. The assignment processor 202 also performs related tasks such as pattern definition and pattern image creation, pattern library management, circuit design and design image creation, and circuit design library management. The assignment processor 202 provides various user interfaces to facilitate these tasks, such as a pattern creation user interface for creating new patterns or a pattern approval interface for accepting, rejecting, modifying, or supplementing results from the pattern identification engine 204.

The following tasks are performed for pattern-based assignment:
1) Pattern definition,
2) Pattern instance identification within a design image, and
3) Assignment of connectors and pad pins within the design image based on identified pattern instances.

Each pattern is defined by a pattern definition including a set of connectors, a set of pad pins, and the assignment between the connectors and the pad pins. The pattern definition also contains information regarding physical layout of the connectors and pad pins, such as the shape, locations, and orientations of the connectors and the pad pins. The pattern creation user interface allows a user to define patterns using a pattern description language. A pattern can be described in plain text format using the pattern description language as discussed below, or some other format. For example, a pattern definition may contain the following information:

1) Pad pin information: pin information contains two parts. The first part is pin name, which defines additional information such as pin shape and pin layer. The second part is about the IO pad which owns the pad pin. Information about the IO pad includes pad type, pad name, pad orientation, and pad origin. An example format used for pin description is provided below. Specifically, "PinKeyword" and "PadKeyword" are two identifiers marking the two parts of pin information, respectively. The $pinName and $pinOwnerPadName are the pin name and corresponding IO pad name, respectively. The $name is a string representing the pad instance name. The $lib cell gives the reference cell name. The $x, $y, and $orientation are the origin and orientation of the pad. There can be multiple lines, representing multiple pins or pads. Multiple pins can share the same pad information.

PinKeyword $pinName $pinOwnerPadName
PadKeyword $name $lib_cell $x $y $orientation 2) Connector information: a connector can be a cell such as a bump or a metal shape. An example format used for connector description is shown below. It starts with an identifier "connectorKeyword." Each connector has an identifier $name. The $layerShapeDescription specifies the shape and layer of the connector. Pin layer is the metal layer on which the pin is located. The pin shape is described by a list of coordinates. If the pin layer and shape is defined by a connector, the $layerShapeDescription can be replaced by the connector name and connector location.

connectorKeyword $name $layerShapeDescription

3) Assignment information: assignment information is described by specifying the set of components of each assignment. An example format used for assignment description is shown below. It starts with an identifier "assignKeyword," followed by a list of connector identifiers and pad pin identifiers. The scope of the assignment is marked by a pair of curly brackets.

assignKeyword {$connector1 . . . $pin1 . . . }

Each pattern definition has a distinct identifier called the pattern definition name. The pattern creation user interface accepts a pattern definition generated by a user. The pattern assignment processor 202 performs error checking for the pattern definition to verify the completeness and correctness of all components and stores the pattern definition into the pattern library 206.

The pattern assignment processor 202 assigns connections between the connectors and pad pins of an IC die based on instances of patterns identified in a design image of the IC die. The identification of instances of patterns is performed by the pattern recognition engine 204. The design of an IC die is defined by a design description, which is used to generate the design image. For any portion of the design image that is not identified as an instance of a pattern, the assignment processor 202 can use other techniques to complete the assignment for the IC die. These other techniques may include allowing the user to manually make assignments or manually identify pattern instances. The assignment processor 202 may perform connector-pad pin assignments for multiple identified instances of patterns concurrently, thus eliminating quality degradation caused by the sequential derivation of assignment results.

The pattern identification engine 204 identifies instances of patterns within the design image to facilitate assignment of connectors and pad pins by the assignment processor 202. For example, given a design image generated from an IC design as input, the pattern identification engine 204 performs a pattern identification that identifies each instance of a pattern in the design image. The pattern identification engine 204 may include circuitry (e.g., a processor that executes software) that implements a machine learning model, such as a convolutional neural network including network layers and kernels that define associations between features in images and a set of patterns. In some embodiments, the machine learning model includes a region-based convolutional neural network that performs a search on the design image by selecting multiple proposed regions (e.g., at multiple scales and having different shapes and sizes), using a convolutional neural network to extract features from each proposed region, and then using the features of the proposed regions to identify instances of patterns and their bounding boxes. In some embodiments, the pattern identification software may be executed on a graphical processing unit (GPU), a central processing unit (CPU) or an application specific integrated circuit (ASIC).

To facilitate pattern recognition, the machine learning model is trained using a training set for each pattern. Each training set of a pattern includes multiple pattern images as examples of the pattern. For example, each pattern may be defined by a base pattern image and one or more perturbation pattern images which include variations of the base pattern image. By using perturbation pattern images, instances of the pattern identified by the pattern recognition engine 204 does not necessarily have to be identical to the pattern images. For example, an identified instance may be required to have the same numbers and types of connectors and pad pins as that of the pattern, but other differences may be allowed. For example, a pattern instance can be different from a base pattern image in the following ways:

1) The pattern instance can be a rotated or flipped transformation of the base pattern image.
2) The pattern instance can be an enlarged or shrunk version of the base pattern image.
3) The pattern instance can be a distorted version of the base pattern image, such as in terms of a pitch adjustment or component modification.

The pattern identification engine 204 may use various types of machine learning models for the pattern recognition. The unique characteristics of VLSI design images may be considered during pattern recognition model selection for better identification speed or accuracy. In some embodiments, techniques other than using a machine learning model may be used to perform pattern identification. Additional details regarding the assignment task using pattern recognition is discussed below in connection with FIGS. 3A, 3B, 4A, 4B, and 5.

The assignment processor 202 provides a pattern approval user interface that allows a user to approve or disapprove pattern instances identified by the pattern identification engine 204. The pattern approval user interface may also allow the user to identify additional pattern instances in the design image manually, or otherwise complete additional assignments between connectors and pad pins.

Each instance of each pattern identified in a design image can be written in a text file, called a pattern identification file. The pattern identification file may use the following format. A $pattern identifier distinguishes various pattern definitions. The $index is an integer, starting from 0. The mapping between objects in the pattern instance and pattern definition is given. The identifier string "connector" and "pad" are used for connector mapping and pad mapping, respectively.

$pattern_identifier $index {
   connector $name_in_design $name_in_pattern_definition
   pad $instance_name_in_design $instance_name_in_pattern
}

After the user reviews the pattern identification file, the assignment processor 202 may create a disapproval file that contains a list of matched pattern instances which are not approved. Disapproved pattern instances are not used for assignment. In some embodiments, the pattern approval user interface allows the user to select an auto-approval option that results in the assignment processor 202 approving all pattern instances identified by the pattern identification engine 204. The pattern approval interface may also allow the user to identify patterns instances missed by the pattern identification engine 204, and these pattern instances may be used for assignment. An approved pattern identification result or user identified pattern identification result provided via the pattern approval user interface may be used to train the pattern identification engine 204 to iteratively improve the machine learning model.

The pattern library 206 stores associations between patterns and the assignment of connectors and pad pins of the pattern. The pattern library 206 may store pattern definitions and pattern images generated from the pattern definitions. Each pattern and its associated data may be identified by a unique pattern identifier. The pattern definition and corresponding pattern images of a pattern may be selected from the pattern library 206 using the pattern identifier. The assignment processor 202 performs management of the stored patterns. Utility functions may be used to perform the following tasks:
1) Pattern definition management: user can add and remove pattern definitions.
2) Pattern definition reporting: user can report pattern definitions.
3) Pattern consistency checking: a pattern library must be consistent with target designs.
   The pads and connectors in a pattern definition must also be included in the pattern images.

The circuit design library 208 stores design descriptions of ICs. The circuit design library 208 may also store design images generated from the design descriptions. Each design description and design image may be identified by a unique design identifier. A design description or design image may be selected from the circuit design library 208 using the design identifier. The circuit design library 208 may also store assignment results of connections between connectors and pad pins of an IC.

The engine trainer 210 is a circuitry (e.g., a processor that executes software) that performs training of the pattern identification engine 204, including auto-training and incremental self-training. Using a set of pattern images for each pattern, the engine trainer 210 trains the pattern identification engine 204 to identify instances of the pattern in design images. The engine trainer 210 generates training data used to tune the parameters of the machine learning model.

As discussed above, the training set for a pattern may include the base pattern image and one or more perturbation pattern images that introduce some perturbation to the base pattern image. For example, the perturbations may include but are not limited to the following list:
1) Orientation change: the entire base pattern image is rotated or flipped.
2) Zooming: the base pattern image is enlarged or shrunk uniformly.
3) Pitch adjustment: the gaps between connectors and/or pads in the base pattern image are changed.
4) Component modification: one or more objects outside of the pattern definition can be added to the base pattern image. In another example, one or more objects may be removed.

The user can control the scale of perturbation used to train the machine learning model. For example, if a strict pattern identification is preferred, perturbations including pitch adjustment and zooming perturbation may be excluded from the training data. On the other hand, if larger perturbation is preferred, perterbations including changes to connector and pad locations may be included in the training data.

The number of pattern images used for training each pattern may be chosen by the user, which ranges from one dozen to tens of thousands. Once all pattern images are created, an automatic flow is used to build the machine learning model of the pattern identification engine 204. Transfer learning techniques may be used where a model that has already been trained may be improved or repurposed. The user only needs to train a new classification layer on top of the model.

The engine trainer 210 performs incremental self-training for the pattern identification engine 204. Instances of a pattern identified by the pattern identification engine 204 may be used as example pattern images of the pattern to train the pattern identification engine 204 for better performance in the future. A pattern instance not identified by the pattern identification engine 204 but identified by a user may also be associated with the pattern and used for training purposes. The portion of the design image identified as the instance by the user may be added to the training set for the pattern. In another example, a pattern instance identified by the pattern identification engine 204 and rejected by a user may also be used for training purposes, such as by providing an example of what should be excluded from a pattern.

Figure 3A:
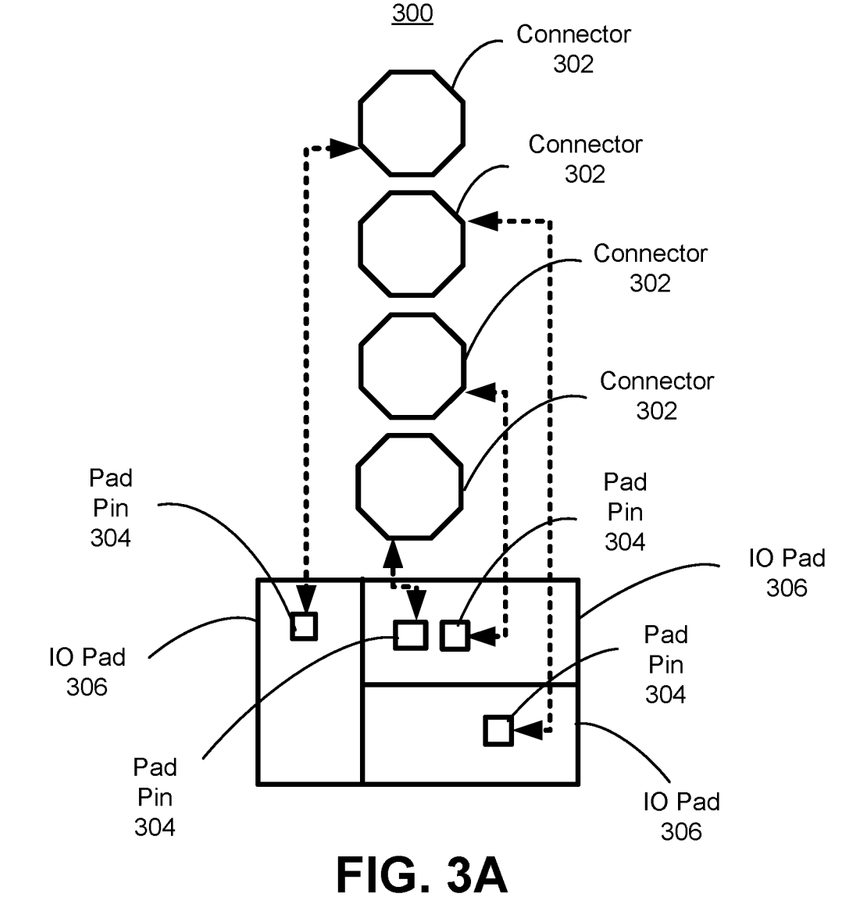
FIG. 3A depicts a base pattern image of a pattern used for assigning connectors with pad pins for an IC die using pattern recognition in accordance with some embodiments of the present disclosure.

FIG. 3A depicts a base pattern image 300 of a pattern used for assigning connectors with pad pins for an IC die using pattern recognition. The base pattern image 300 includes four connectors 302 represented by octagons and four pad pins 304 represented by squares. The four pad pins 304 belong to three TO pads 306 represented by rectangles. Both connectors 302 and TO pads 306 are placed. Namely, the relative locations of connectors 302 and TO pads 306 with respect to each other are known and unchangeable. The dotted double-arrow lines, which may be excluded from pattern images, represent the assignment between connectors and pad pins of the pattern as defined by the pattern definition. The base pattern image 300 and perturbation pattern images of the pattern may be generated from the pattern definition of the pattern.

Figure 3B:
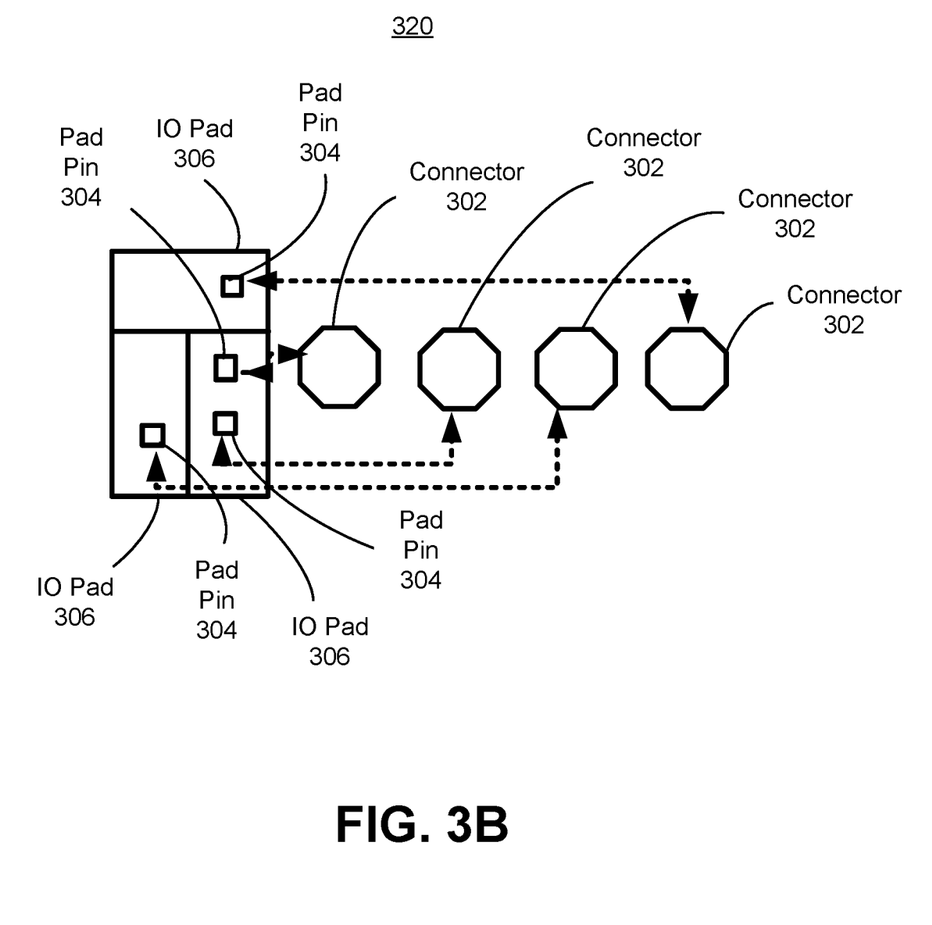
FIG. 3B depicts a perturbation pattern image of a pattern in accordance with some embodiments of the present disclosure.

FIG. 3B depicts a perturbation pattern image 320 of the pattern. The perturbation pattern image 320 is a perturbation of the base pattern in image 300. The perturbation pattern image 320 includes the same number of connectors and pad pins as the base pattern image 300. However, the perturbation pattern image 320 is a rotated and shrunken version of the base pattern image 300. Furthermore, the pitch between the connectors 302 is increased in the perturbation pattern image 320 relative to the pitch between the connectors 302 in the base pattern image 300. For each pattern, the machine learning model may be trained using a base pattern image and perturbation pattern images of the base pattern image as examples of the pattern.

Figure 4A:
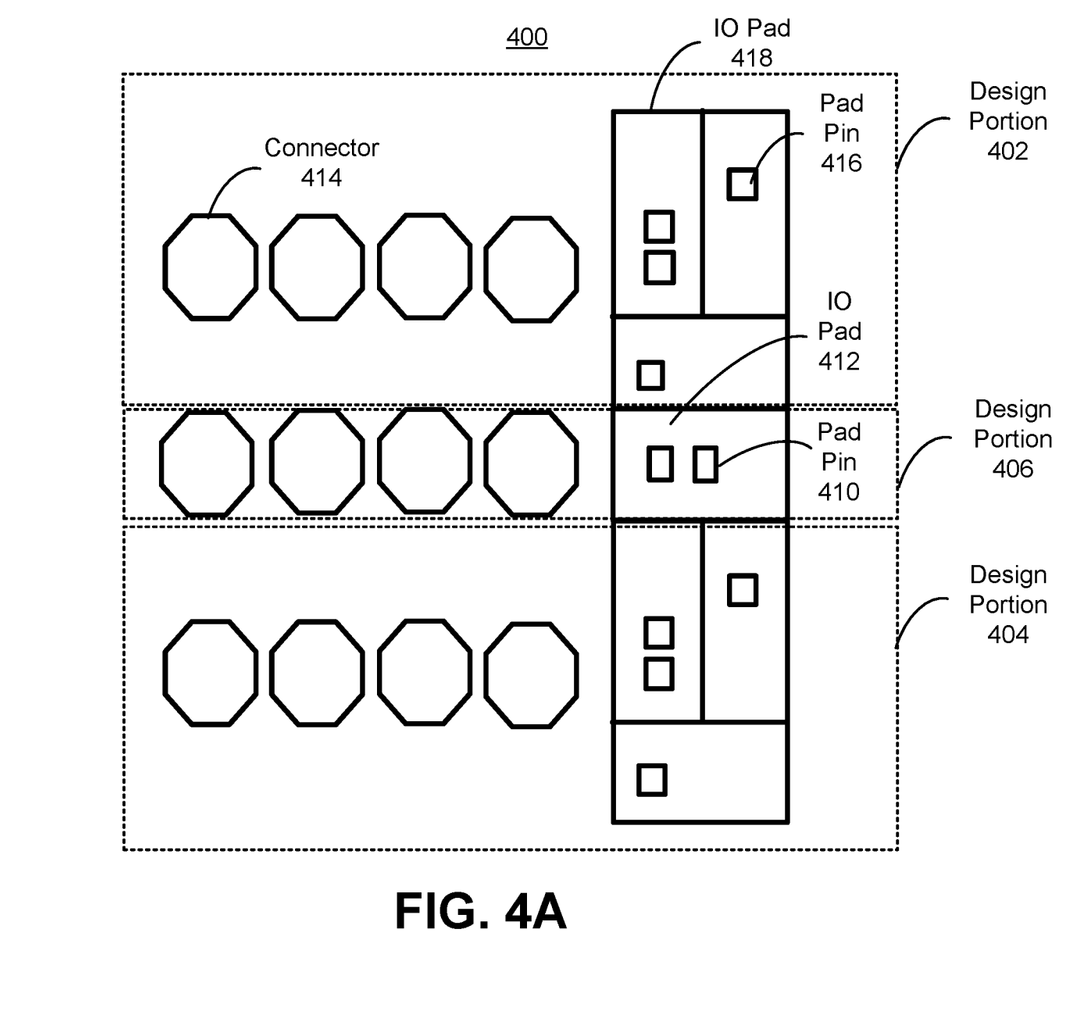
FIG. 4A depicts a design image of an IC die in accordance with some embodiments of the present disclosure.

FIG. 4A depicts a design image 400 of a design of an IC die. The design image 400 includes two design portions 402 and 404 that match the pattern defined by the pattern images 300 and 320 in respective FIGS. 3A and 3B. For example, the design portion 402 includes connectors 414 that correspond with the connectors 302 of the pattern, pad pins 416 that correspond with the pad pins 304 of the pattern, and TO pads 418 that correspond with the TO pads 306 of the pattern. The design image 400 also includes a design portion 406 that is unlike the pattern. For example, the design portion 406 differs from the pattern by including two pad pins 410 and one IO pad 412, as well as including different spatial layouts of these components.

Figure 4B:
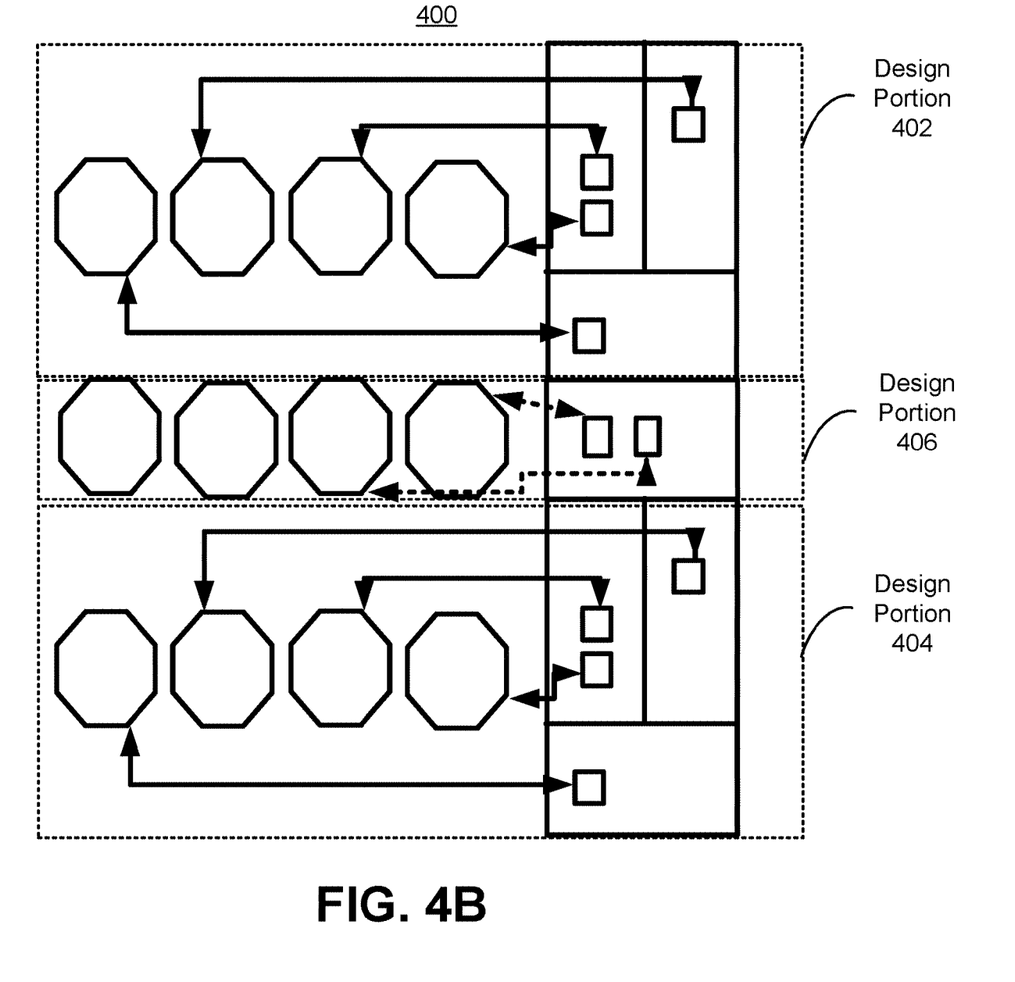
FIG. 4B depicts an assignment result from identified instances of a pattern within a design image in accordance with some embodiments of the present disclosure.

FIG. 4B depicts an assignment result from identified instances of the pattern defined by the pattern images 300 and 320 in respective FIGS. 3A and 3B within the design image 400. The solid lines represent assignment based on the pattern matching for the design portions 402 and 404. The connectors and pad pins not in any pattern instances can be assigned by another type of assignment solver, as shown by the design portion 406 using the dotted lines.

Figure 5:
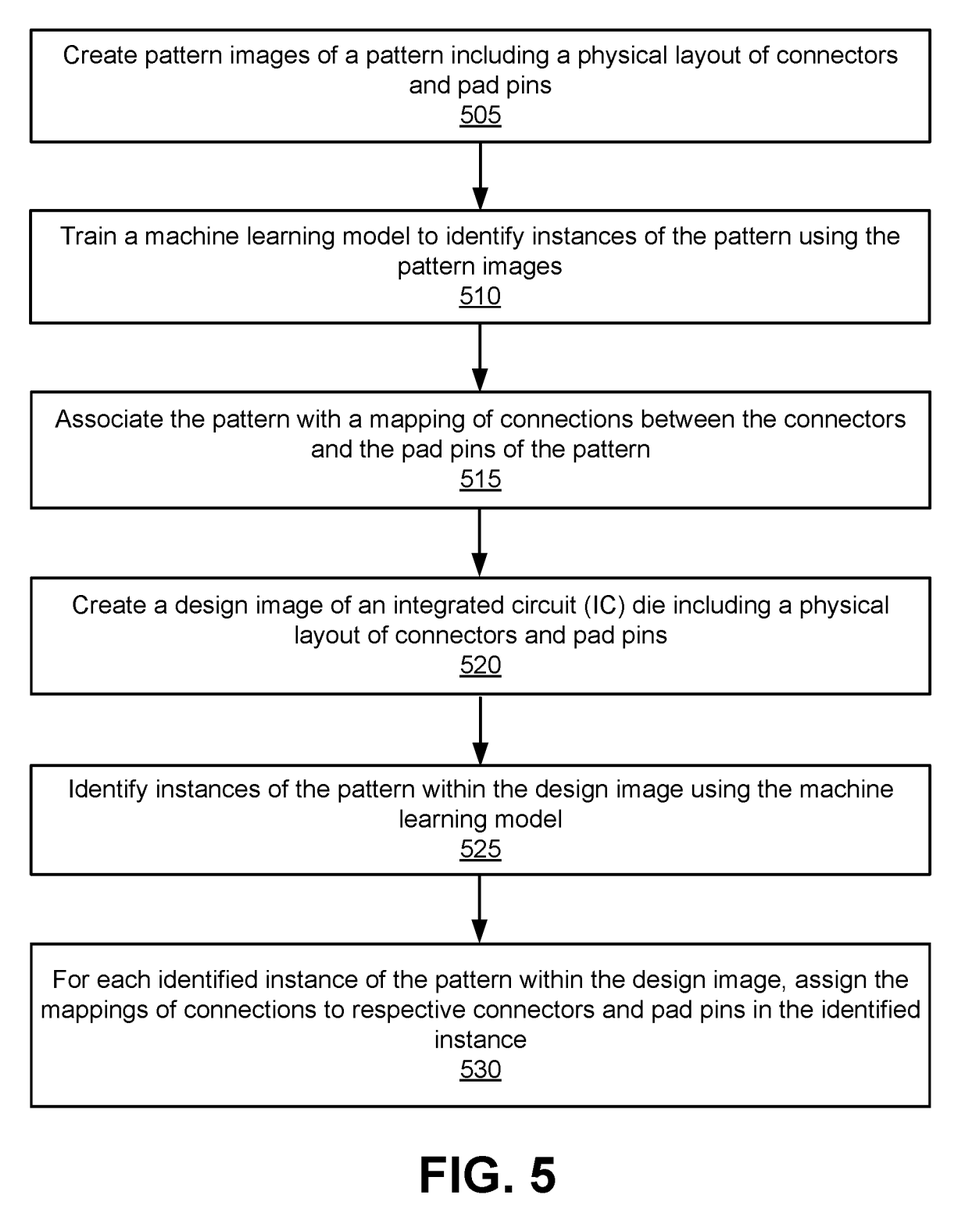
FIG. 5 depicts a method for assigning connectors with pad pins for an IC die using pattern recognition in accordance with some embodiments of the present disclosure.

FIG. 5 depicts a method for assigning connectors with pad pins for an IC die using pattern recognition. The method may be performed by components of the system 200, or other computing components may perform some or all of the steps in other embodiments. Embodiments may include different and/or additional steps or perform the steps in different orders.

The assignment processor 202 creates 505 one or more pattern images of a pattern including a physical layout of connectors and pad pins. The pattern images may be created from a pattern definition that defines the physical layout of the connectors, pad pins, and IO pads. The pattern definition may further include layout information used to generate the pattern images, such as the shapes and locations of the connectors, pad pins, and IO pads. The pattern images may include a base pattern image and perturbation pattern images. The pattern images and the pattern definition of the pattern may be stored in the pattern library 206.

The engine trainer 210 trains 510 a machine learning model to identify instances of the pattern using the one or more pattern images. The machine learning model may be implemented by the pattern identification engine 204. The machine learning model may include a convolutional neural network, such as a region-based convolutional neural network. A training set of pattern images of the pattern may be created from the pattern definition and used to train the neural network model to recognize the pattern. The training set for the pattern may include the base pattern image and the perturbation pattern images.

The assignment processor 202 associates 515 the pattern with a mapping of connections between the connectors and the pad pins of the pattern. The pattern definition also defines the mapping of the connections between the connectors and the pad pins. The pattern and pattern images of the pattern may be associated with the mapping such that when an instance of the pattern is identified in a design image, the associated mapping can be retrieved and used for assignment for connectors and pad pins within the identified instance.

The assignment processor 202 creates 520 a design image of an IC die including a physical layout of connectors and pad pins. The design image may be created from a design description of the IC die. The design image may use a similar visual style or the same visual style as the pattern images to facilitate instance identification. For example, the boundary shapes are drawn in the pattern and design images for connectors. For IO pad pins, the pin shapes are drawn in the images. The IO pad boundary boxes can be included as an option. Different colors may be used for connectors, pad pins, and IO pads.

The pattern identification engine 204 identifies 525 instances of the pattern within the design image using the machine learning model. Each portion of the design image identified as a pattern is referred to as an instance or pattern instance. By using the base pattern image and perturbation pattern images to train the pattern identification engine 204, the relative locations of corresponding connectors and pad pins in each instance are similar to those in the pattern but the instance does not have to be identical to any of the pattern images used in the training. The pattern identification engine 204 may be trained using a selection of perturbation pattern images that provide examples of permissible variances in the design image for identification as the pattern.

The pattern identification engine 204 may concurrently identify instances of multiple patterns within the design image. Each pattern may be defined by a base pattern image and perturbation pattern images that are used to train the pattern identification engine 204. Each pattern is also associated with a mapping of connections between connectors and pad pins.

The assignment processor 202 assigns 530, for each identified instance of the pattern within the design image, the mapping of connections to respective connectors and pad pins in the identified instance. The connectors and pad pins of identified instance of the pattern within the design image corresponds to the connectors and pad pins of a portion of the IC die. The assignment may be written to a pattern identification file and used during the manufacturing of the IC die. The pattern identification file may be stored in the circuit design library 208.

In some embodiments, the assignment processor 202 provides a user approval interface that allows the user to approve or disapprove of the identified instances of the pattern. The user approval interface may also allow the user to modify, add or remove connections in the assignment or manually identify instances of the pattern. The matching and assignment information provided by the user via the user approval interface may also be used to generate training data used to train the matching learning model. For example, an image of the instance identified by the user may be used an example of the pattern (e.g., as a perturbation pattern image) to improve the pattern recognition engine 204.

In some embodiments, the assignment processor 202 performs an iterative matching process. A bounding box for each identified instance of one or more patterns within the design image is calculated. The connectors and pad pins inside the bounding boxes of the design image are collected and mapped to the connectors and pad pins in the pattern definition. If the mapping is successful, a pattern instance is considered as being found. The matched connectors and pad pins are identified, stored in an object list, and later reported. All pattern instances identified are processed in the same way. The design image is re-generated without the objects already identified in the pattern instances, and the matching step is repeated. The iteration ends when no more matches are made by the pattern identification engine 204.

Figure 6:
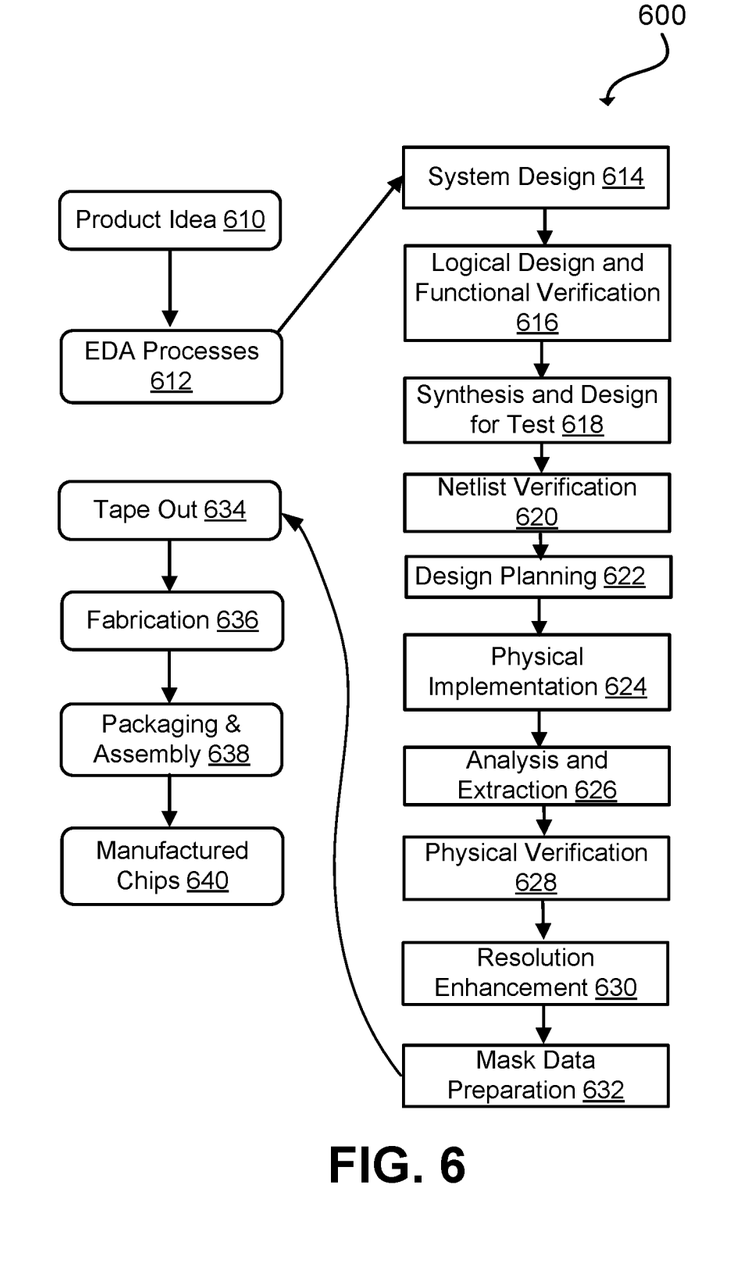
FIG. 6 depicts a flowchart of various processes used during the design and manufacture of an integrated circuit in accordance with some embodiments of the present disclosure.

FIG. 6 depicts an example set of processes 600 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 610 with information supplied by a designer, information which is transformed to create an article of manufacture that uses a set of EDA processes 612. When the design is finalized, the design is taped-out 634, which is when artwork (e.g., geometric patterns) for the integrated circuit is sent to a fabrication facility to manufacture the mask set, which is then used to manufacture the integrated circuit. After tape-out, a semiconductor die is fabricated 636 and packaging and assembly processes 638 are performed to produce the finished integrated circuit 640.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 6. The processes described by be enabled by EDA products (or tools).

During system design 614, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 616, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 618, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 620, the netlist is checked for compliance with timing constraints and for correspondence with the HDL code. During design planning 622, an overall floor plan for the integrated circuit is constructed and analyzed for timing and top-level routing.

During layout or physical implementation 624, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 626, the circuit function is verified at the layout level, which permits refinement of the layout design. During physical verification 628, the layout design is checked to ensure that manufacturing constraints are correct, such as DRC constraints, electrical constraints, lithographic constraints, and that circuitry function matches the HDL design specification. During resolution enhancement 630, the geometry of the layout is transformed to improve how the circuit design is manufactured.

During tape-out, data is created to be used (after lithographic enhancements are applied if appropriate) for production of lithography masks. During mask data preparation 632, the 'tape-out' data is used to produce lithography masks that are used to produce finished integrated circuits.

A storage subsystem of a computer system (such as computer system 700 of FIG. 7) may be used to store the programs and data structures that are used by some or all of the EDA products described herein, and products used for development of cells for the library and for physical and logical design that use the library.

Figure 7:
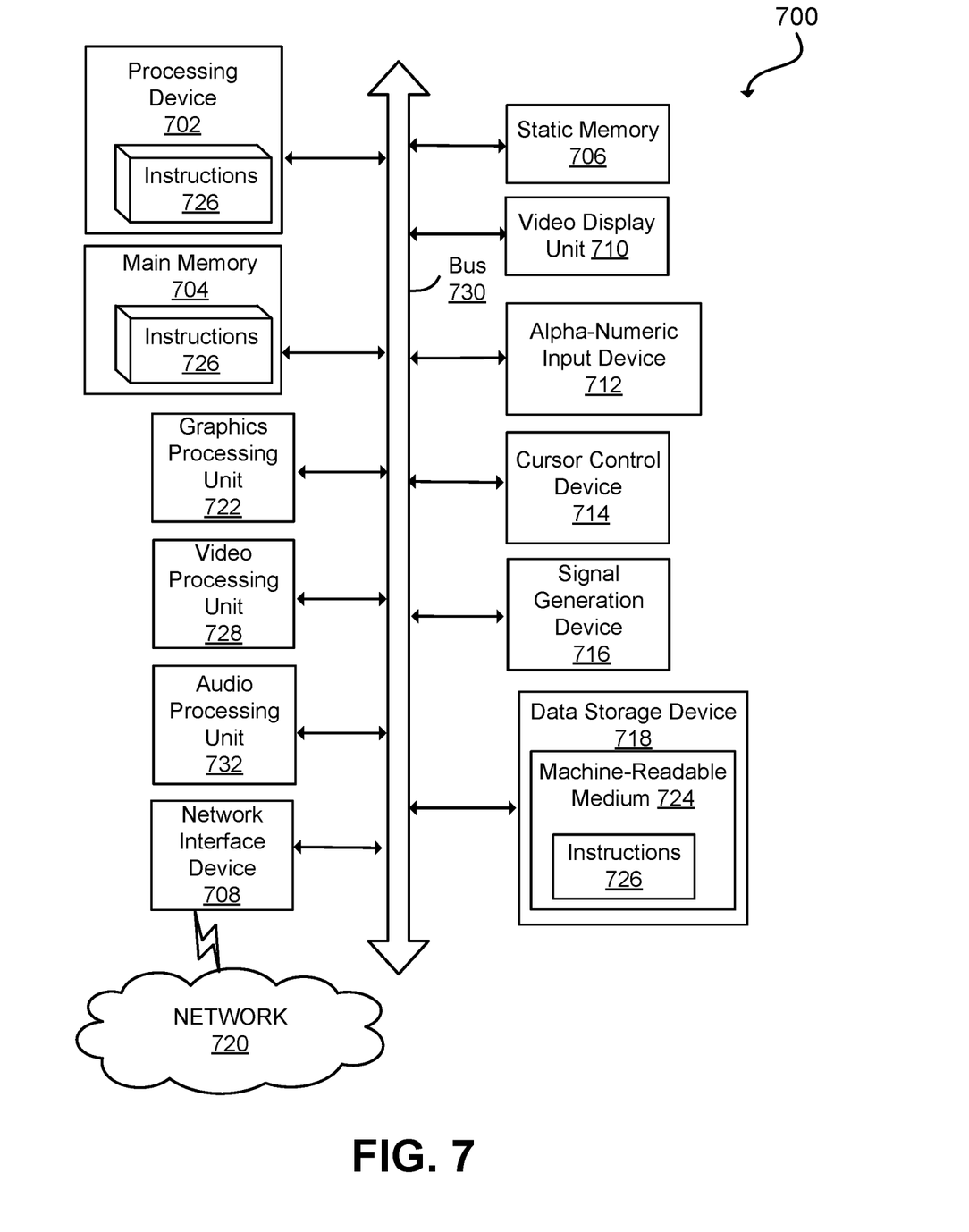
FIG. 7 depicts an abstract diagram of an example computer system in which embodiments of the present disclosure may operate.

FIG. 7 depicts an example machine of a computer system 700 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730.

Processing device 702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 may be configured to execute instructions 726 for performing the operations and steps described herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a machine-readable storage medium 724 (also known as a non-transitory computer-readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
    generating a training set of pattern images defining examples of a pattern within design images of integrated circuit (IC) dies, the pattern comprising a physical layout of connectors and pad pins, the pattern images including a base pattern image and perturbations of the base pattern image;
    training, by a processor using the training set, a machine learning model to identify instances of the pattern within the design images;
    determining that an instance of the pattern within a design image of an IC die is not identified by the machine learning model, the design image comprising a physical layout of connectors and pad pins within the IC die; and training the machine learning model using an image of the instance as an example of the pattern.

2. The method of claim 1, further comprising providing a user interface that allows a user to identify the instance of the pattern within the design image that is not identified by the machine learning model.

3. The method of claim 1, further comprising training the machine learning model using a second image of a second instance of the pattern identified within the design image by the machine learning model.

4. The method of claim 1, further comprising:
rejecting a second instance of the pattern within the design image identified by the machine learning model; and
training the machine learning model using a second image of the second instance as an example that is excluded from the pattern.

5. The method of claim 1, wherein the perturbations of the base pattern image include at least one of:
an enlarged or shrunken transformation of the base pattern image;
a pitch adjustment of the base pattern image; and
a component modification to the base pattern image.

6. The method of claim 1, wherein the perturbations of the base pattern image include at least one of:
a change to a location of a connector; and
a change to a location of a pad pin.

7. The method of claim 1, wherein the perturbations of the base pattern image do not include:
an enlarged or shrunken transformation of the base pattern image; or
a pitch adjustment of the base pattern image.

8. The method of claim 1, further comprising adjusting a number of the perturbations of the base pattern image in the training set.

9. The method of claim 1, wherein training the machine learning model to identify instances of the pattern within the design images comprises:
identifying, using the machine learning model, the instances of the pattern within the design image of the IC die; and
tuning parameters of the machine learning model based on the identified instances of the pattern.

10. The method of claim 1, wherein the design image includes more than one thousand connectors.

11. A system, comprising:
a memory storing instructions; and
one or more processors, coupled with the memory and to execute the instructions, the instructions when executed cause the one or more processors to:
generate a training set of pattern images defining examples of the pattern, the pattern comprising a physical layout of components, the pattern images including a base pattern image and perturbations of the base pattern image;
train, using the training set, the machine learning model to identify instances of the pattern within the design images;
determine that an instance of the pattern within a design image of an IC die is not identified by the machine learning model, the design image comprising a physical layout of components within the IC die; and
train the machine learning model using an image of the instance as an example of the pattern.

12. The system of claim 11, wherein the instructions further cause the one or more processors to provide a user interface that allows a user to identify the instance of the pattern within the design image that is not identified by the machine learning model.

13. The system of claim 11, wherein the instructions further cause the one or more processors to train the machine learning model using a second image of a second instance of the pattern identified within the design image by the machine learning model.

14. The system of claim 11, wherein the instructions further cause the one or more processors to:
reject a second instance of the pattern within the design image identified by the machine learning model; and
train the machine learning model using a second image of the second instance as an example that is excluded from the pattern.

15. The system of claim 11, wherein the perturbations of the base pattern image include at least one of:
an enlarged or shrunken transformation of the base pattern image;
a pitch adjustment of the base pattern image; and
a component modification to the base pattern image.

16. A non-transitory computer readable medium comprising stored instructions, which when executed by one or more processors, cause the one or more processors to:
generate a training set of pattern images defining examples of the pattern, the pattern comprising a physical layout of connectors and pad pins, the pattern images including a base pattern image and perturbations of the base pattern image;
train, using the training set, the machine learning model to identify instances of the pattern within the design images;
determine that an instance of the pattern within a design image of an IC die is not identified by the machine learning model, the design image comprising a physical layout of connectors and pad pins within the IC die; and
train the machine learning model using an image of the instance as an example of the pattern.

17. The computer readable medium of claim 16, wherein the perturbations of the base pattern image include at least one of:
a change to a location of a connector; and
a change to a location of a pad pin.

18. The computer readable medium of claim 16, wherein the perturbations of the base pattern image do not include:
an enlarged or shrunken transformation of the base pattern image; or
a pitch adjustment of the base pattern image.

19. The computer readable medium of claim 16, wherein the instructions further cause the one or more processors to adjust a number of the perturbations of the base pattern image in the training set.

20. The computer readable medium of claim 16, wherein the instructions that cause the one or more processors to train the machine learning model to identify instances of the pattern within the design image comprises instructions that cause the one or more processors to:
identify, using the machine learning model, the instances of the pattern within the design image of the IC die; and
tune parameters of the machine learning model based on the identified instances of the pattern.

* * * * *